United States Patent
Jones et al.

(10) Patent No.: US 6,690,154 B2
(45) Date of Patent: Feb. 10, 2004

(54) HIGH-FREQUENCY TESTER FOR SEMICONDUCTOR DEVICES

(76) Inventors: Joe David Jones, 23 Cicero St., Austin, TX (US) 78746; Mitchell K. Alsup, 2103 Kemper Cove, Austin, TX (US) 78746

( * ) Notice: Subject to any disclaimer, the term of this patent is extended or adjusted under 35 U.S.C. 154(b) by 50 days.

(21) Appl. No.: 09/800,336

(22) Filed: Mar. 6, 2001

(65) Prior Publication Data

US 2002/0125878 A1 Sep. 12, 2002

(51) Int. Cl.[7] .............................................. G01R 32/26
(52) U.S. Cl. ..................................... 324/158.1; 324/765
(58) Field of Search ............................. 324/158.1, 765, 324/763, 764; 714/28

(56) References Cited

U.S. PATENT DOCUMENTS

| | | | | |
|---|---|---|---|---|
| 4,364,110 A | * | 12/1982 | Hyatt | 700/180 |
| 4,924,179 A | * | 5/1990 | Sherman | 324/537 |
| 5,228,039 A | * | 7/1993 | Knoke et al. | 714/28 |
| 6,104,330 A | * | 8/2000 | Redman-White et al. | 341/150 |
| 6,329,940 B1 | * | 12/2001 | Dedic | 341/144 |

* cited by examiner

Primary Examiner—Kamand Cuneo
Assistant Examiner—Tung X. Nguyen
(74) Attorney, Agent, or Firm—Vinson & Elkins L.L.P.

(57) ABSTRACT

A new system and method for high-speed testing of semiconductor devices is disclosed. The system utilizes bi-directional FET switches to hide the delay related to the distance signals have to travel between the test head electronics and the device under test. The effect is to increase the frequency with which a prior art tester can test a device. By placing the FET switches closer to the device under test, the device operates on the tester in the same electrical environment as it would in actual use. The device under test can be switched from receiving an input signal to driving an output signal in less time than the TL delay between the test head electronics and the device under test.

13 Claims, 10 Drawing Sheets

HIGH-FREQUENCY TESTER FOR SEMICONDUCTOR DEVICES

FIELD OF THE INVENTION

The Invention relates generally to the field of semiconductors, and more specifically to a system and a method for testing very high frequency processors, memory devices, and other high speed semiconductor devices.

RELATED ART

As semiconductor technology continues to improve, semiconductor devices operate at increasingly higher frequencies and lower cycle times. As cycle times for leading edge semiconductors decrease, the devices used to determine whether such devices are functioning properly, known as testers, must also operate at increasingly high frequencies to provide a meaningful test of the semiconductor device under the conditions it is expected to operate. While the electronic capabilities of the Test Head Electronic Modules have more than kept pace with modem silicon semiconductor devices, the packaging technology interfacing the Device Under Test to the Test Head Electronics has not. This has created a problem where a tester cannot present the electrical environment of the Device In Use to the Device Under Test. The tester cannot, therefore, fully test the Device Under Test as it will be used as a Device In Use.

Current art high performance testers are normally configured much like one shown in FIG. 1. As can be seen form FIG. 1, such a tester consist of a main frame 1, a test head 2, cabling 3 between the main frame 1 and the test head 2, and a means to position said test head in any stable orientation (articulation 4), so that many different pieces of device handling equipment can be interfaced to the test head. Inside the Test Head 2 reside the Test Head Electronics Modules 5 ("THEM"). There are several kinds of Test Head Electronics Modules to support different testing requirements of the multiplicity of devices which the tester is capable of testing. High speed clocking, analog I/O, digital I/O, and Power Supply regulation are just some of the possible Test Head Electronics Modules. The existence of these modules inside the test head facilitate configuration, maintenance, and the ability to be upgraded. Considerable attention has been used in the design, manufacture, packaging, cooling, and construction of the Test Head and its Electronics.

On the tester and inside the test head are disposed the Test Head Electronics Modules 5, depicted in FIG. 2. The THEM are a collection of highly sophisticated electronic circuits for driving and receiving test patterns, controlling and measuring signal timings, and is designed and developed for each line of Testers from any given manufacturer. Each THEM is interfaced to the tester mainframe by a cable 2 and through a bundle of said cables 3. Each THEM is, in turn, connected to the Device Under Test Connector 7, then to the Device Under Test Board 8, and finally to the Device Under Test through a connector 9. FIG. 3 shows the Test Head interfacing with a device handler, while FIG. 4 shows the same tester interfacing to an electron beam device used to measure electrical signals. The flexibility to be interfaced to a multiplicity of test, measurement, and manufacturing equipment, and the ability to be programmed to test a multiplicity of devices through interchangeable Device Under Test Boards, imposes a set of basic requirements on the packaging of the tester and especially of the test head electronics.

Test Head Electronics Modules are typically constructed of high performance Gallium Arsenide ("GaAs") semiconductor materials. GaAs technology can operate at much higher frequencies than silicon semiconductor devices, and can tolerate higher voltage levels than the fastest silicon semiconductor devices can tolerate, and allows the construction of Test Head Electronics Modules with the ability to drive signals fast enough to test even the highest performance silicon semiconductor devices. Current silicon semiconductor technology is not capable of producing devices which can operate at these performance levels. As a result, test head electronics modules are usually constructed of GaAs technologies, and are (in general) capable of much higher performance than the devices they test. Until recently, GaAs Test Head Electronics Modules were sufficiently fast that testing the high speed signals emanating from silicon semiconductor devices could be performed with little respect for the electrical distance the signals had to travel between the Test Head Electronics Modules and the Device Under Test.

The Test Head Electronics Modules operate at very high frequencies at voltage levels above those tolerated by the high speed Device Under Test, and can, thereby, generate a great deal of heat. The Test Head has been carefully designed to deliver carefully regulated power to each Test Head Electronics Module and careful consideration has been given to cooling each Test Head Electronics Module to insure stable, reliable, and sensitive operation, and high performance signal characteristics. Therefore, the cabling 3 contains signal wires, power supply busses, and means to cool the electronics in the Test Head. This cable must not only carry the plethora of signals, power, and cooling, but must also be capable of accommodating the articulation of the Test Head from the fixed position Main Frame.

A Device Under Test must be supplied with power, clocking, and signals in order to function. The Device Under Test may have a large number of signals, a plurality of clock signals, and consume a large amount of power. A different device may have a lesser number of signals, a different plurality of clock signals, and considerably less power. The Test Head, depicted in FIG. 2, accommodates a multiplicity of different devices by relying on replaceable components known as Device Under Test Boards (DUT Boards) 8. These DUT Boards interface to the Test Head by means of the DUT Board Connector 7, and interface to the Device Under Test through the Device Under Test Connector 9. Many testers now support upwards of 1000 signaling pins.

The Test Head has to be as small as possible to most accurately reflect the electrical environment of the Device In Use while testing said device as Device Under Test. But the minimum size of the test head is fixed by the maximum number of signal pins which interface the Test Head Electronic Modules to the Device Under Test through the DUT Board Connector 7. The Test head is as small as practicable given the plethora of design and use requirements. It is this very size which gives rise to the problem the present invention overcomes.

While the electrical distance between the Test Head Electronics Modules and the device under test remains constant as operating frequencies increases, it takes a progressively larger percentage of a cycle time for a signal to traverse the distance from the THEM to the DUT or to traverse the (same) distance from the DUT to the THEM. As long as any particular signal only traverses the connecting wire in one direction (THEM to DUT, or DUT to THEM), the electrical distance between the THEM and the DUT 41 can be compensated by programming the Test Head Electronics Modules to send these signals 43 from an earlier point in time to the Device Under Test 47, and by programming the Test Head Electronics Modules to receive those signals 45 from the Device Under Test at a later point in time 46. But when signals must traverse the connecting wire in both directions, the tester can no longer fully compensate for the increasing delay 44.

In order to fully characterize Devices Under Test, testers must do more than simply drive digital patterns to the DUT and simply receive digital patterns back from the DUT. Testers are called upon to generate carefully controlled output voltage or current levels at carefully positioned moments in time.

The ability to program a plurality of voltage levels for different signals on different wires and carefully controlling the timing of events across all of these interfacing wires allows the tester to be full utilized in solving its electrical distance problem.

Testers are called upon to measure voltages, currents, and when a voltage or current crosses a specified value. Through these measurements the Devices under test can be tested against not just its operating frequency, but also measured for compliance with respect to its electrical specifications. By repeating these measurements over a vast set of operating conditions and timing arrangements, the true window of safe operation of a DUT can be determined, but more importantly, those events and conditions which impair the functioning of the DUT can be isolated, analyzed and used to propose improvements to the design of the device.

It is the independent programmability of voltage, current, time, and levels that give the Test Head Electronics Modules much of its capability. These capabilities are not compromised under the implementation of the current invention.

A tester represents a large investment for a company manufacturing semiconductor devices, therefore, these companies will desire to maximize their ability to keep these testers busy with the work of testing devices. DUT Boards are often replaced between batches of semiconductor devices and new testing programs loaded into the tester pertinent to the next batch of devices to be tested. Therefore, it is common for DUT Boards to be replaced on the tester, and due to the mechanical stresses of being attached and removed from the Test Head these DUT Boards occasionally require maintenance.

Given the myriad of configuration and the requirement for rapid change from one testing configuration to another, Tester Manufactures are reluctant to place Test Head Electronics Modules directly on the Device Under Test Boards. The present invention alleviates this concern of the placement of such electronics so close to the Devices Under Test. The Test Head Electronics Modules can safely reside in the Test Head, and remotely control MOS devices used as nearly ideal switches to enable testing devices in the electrical environment seen by the Device In Use.

Without loss of generality, FIG. 5 shows a highly simplified schematic of a high speed DDR SRAM 19 attached to a high performance processor (CPU 10) in an Devices In Use ("DIU") electrical environment. This is the environment that the designers of this processor and the designers of this SRAM envisioned. In this electrical environment, each interfacing wire is short, and thereby has a low transit time 21. In order to use the data bus 14 in a bidirectional manner, the currently enabled driver must be turned off, a period of time must exist where neither driver is enabled, and then the other driver can be enabled. Therefore, to change the direction of signal flow (DUT to THEM, or THEM to DUT) the bus 14 must not be driven by either the processor 10 nor the DDR SRAM 20 for short intervals of time 24, 25 and 26.

After the last unit of data 27 is driven from the DDR SRAM and received by the processor, the processor waits an amount of time 25 before sending new information to the DDDR SRAM 23. Reliable operation of the bus occurs when the turn around intervals 24, 25, and 26 remain positive units of time. The low latency electrical environment of allow these two Devices In Use to operate reliably.

Again without loss of generality, FIG. 6 shows this same high speed DDR SDRAM 19 attached to a current art high performance tester 30 in the typical electrical environment found on a current art tester. A person of ordinary skill in the art will immediately see that this environment has a necessarily longer transit time 40. The higher latency electrical environment of the Device Under Test makes one of the bus turn around events 44 impossible to achieve. The last unit of information 46-R3 from the DDR SRAM 19 is still arriving when the first unit of information 43-W4 must be driven by the Test Head Electronics Modules 30. The prior art tester is not capable of operating the Device Under Test in the electrical environment of the Device In Use.

It has therefore become desirable to develop a new method and system for presenting the In Use electrical environment to the Device Under Test, to allow for testing semiconductor devices at very high frequencies, as accomplished by the present invention.

SUMMARY OF THE INVENTION

The present invention allows a tester to operate the Device Under Test much more like the Device In Use, and, thereby, allow the tester to more fully characterize these high speed devices. FIG. 7 shows the present invention in its most abstract form. A switch 60 on the DUT Board placed close to the DUT Socket 34 and is controlled from the tester 61 and avoids any signal interference 64 by utilizing a plurality of signaling wires 65 and 66. The close placement of this switch to the DUT re-establishes the small electrical environment 68 for the Data Bus 67 of the Device In Use and allows the tester to fully characterize the Device Under Test. The switch must be capable of opening and closing faster than the smallest unit of information transferred.

BRIEF DESCRIPTION OF THE DRAWINGS

The present invention is illustrated by way of example and not limited in the accompanying figures, in which like references indicate similar elements, and in which.

DETAILED DESCRIPTION OF THE DRAWINGS AND PREFERRED EMBODIMENTS OF THE INVENTION

Figure 1:
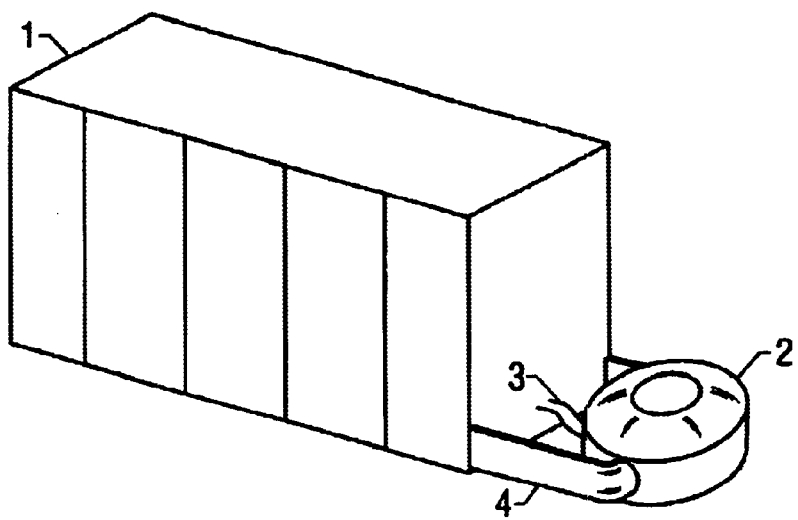
FIG. 1 is a prior art schematic of a typical prior art tester configuration.

FIG. 1 is a prior art schematic of a typical prior art tester configuration. The mainframe 1 contains the tester, a control computer, power supplies, and cooling equipment. The Test Head 2 is attached to the mainframe 1 and held steady by the articulator 4, and connected to the tester through a bundle of cables 3.

Figure 2:
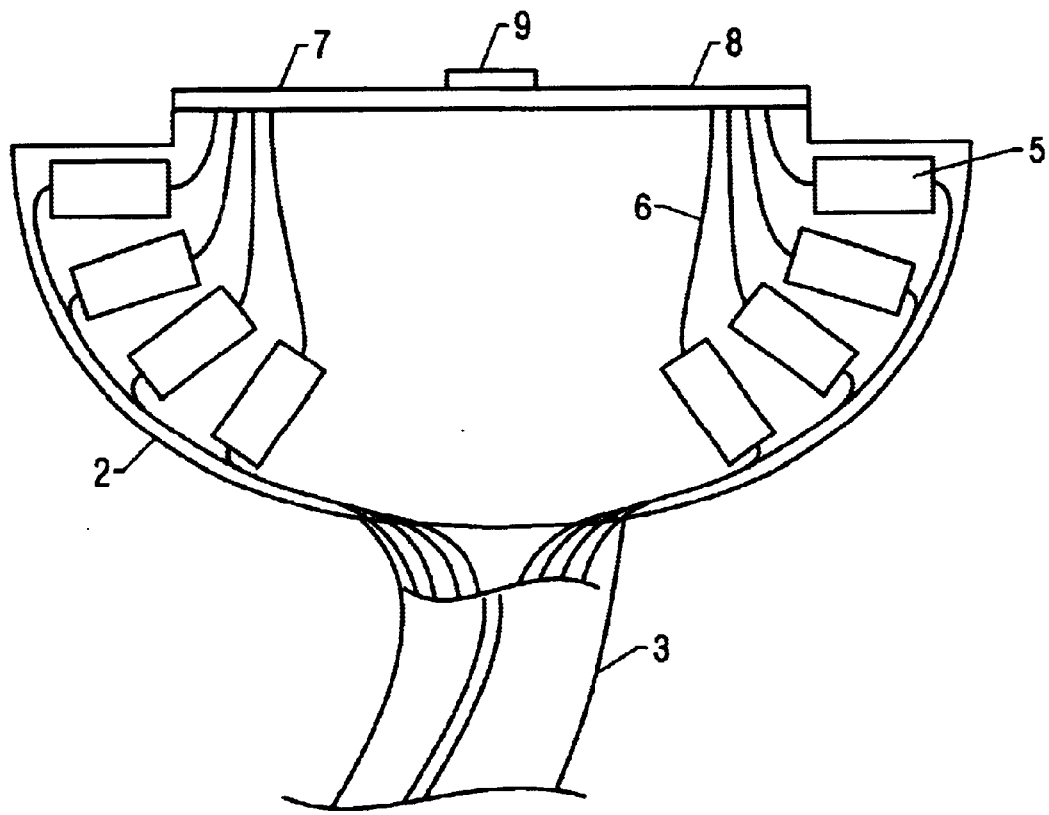
FIG. 2 is a prior art schematic showing an exploded view of the test head.

FIG. 2 is a prior art schematic showing an exploded view of the test head. The Test Head 2 holds a plurality of Test Head Electronics Modules 5 which are connected to the mainframe through the bundle of cables 3, and connected to the DUT Board 8 by means of the DUT Board Connector 7. On the DUT Board resides a Socket 9 that holds the Device Under Test stable during the period of time spent testing the device.

Figure 3:
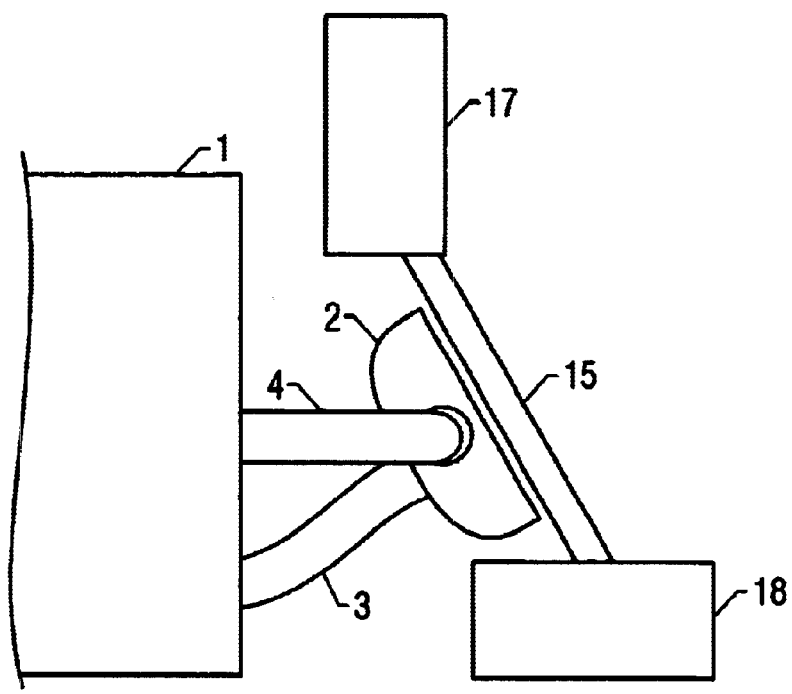
FIG. 3 is a prior art schematic showing an exemplary test head configuration.

FIG. 3 is a prior art schematic showing an exemplary test head configuration. The Test Head 2 is held steady on the back face of the Device Handler 15 through the articulator 4 on the Mainframe 1 and receives test patterns through the bundle of cables 3. This may be considered a standard production work environment for a tester. The device handler is responsible for sequencing a number of Devices to be Tested from the upper holding bins 17 to the Test Head 2. The tester is responsible for running one or more test patterns through the DUT and determining the quality of this device. Subsequently, the handler sequences that device just tested to a suitable bin corresponding to the quality of the device just tested. So automated, a tester and a handler can sequence hundreds or thousands of parts without human intervention.

Figure 4:
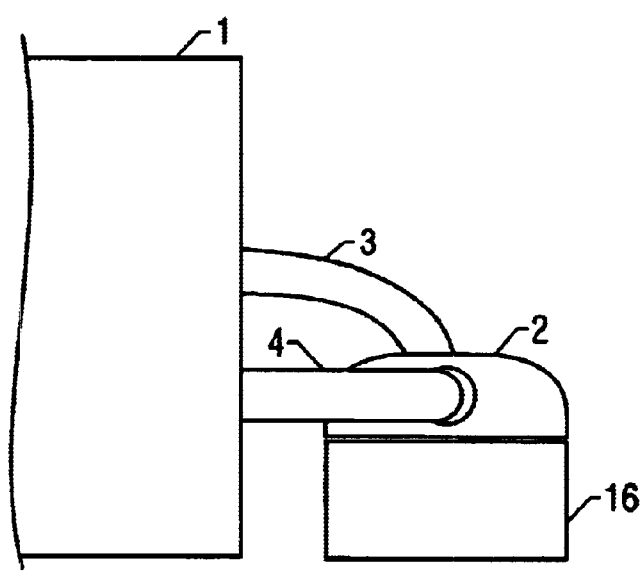
FIG. 4 is a prior art schematic showing an alternate test head configuration.

FIG. 4 is a prior art schematic showing an alternate test head configuration. The Test Head 2 is held steady to the top of an electron beam signal measuring device 16 to the mainframe 1 by the articulator 4 and receives test patterns through the bundle of cables 3. This drawing represents the tester used as a stimulation engine, while the human operates the electron beam signal measuring device to compare voltages on wires on the device being stimulated. By repeatedly stimulating the same signals inside the device and controlling their voltage and current levels and carefully positioning these events in time, the human operator can determine a cause of events leading the device to operate incorrectly. The articulator is a key ingredient in the flexibility and utility of a high performance tester.

Figure 5:
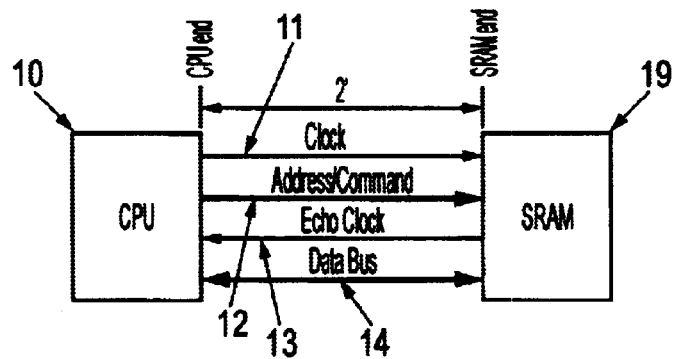
FIG. 5 is a diagram showing a processor attached to an SRAM in the Device In Use environment, along with a corresponding timing diagram.
Figure 5:
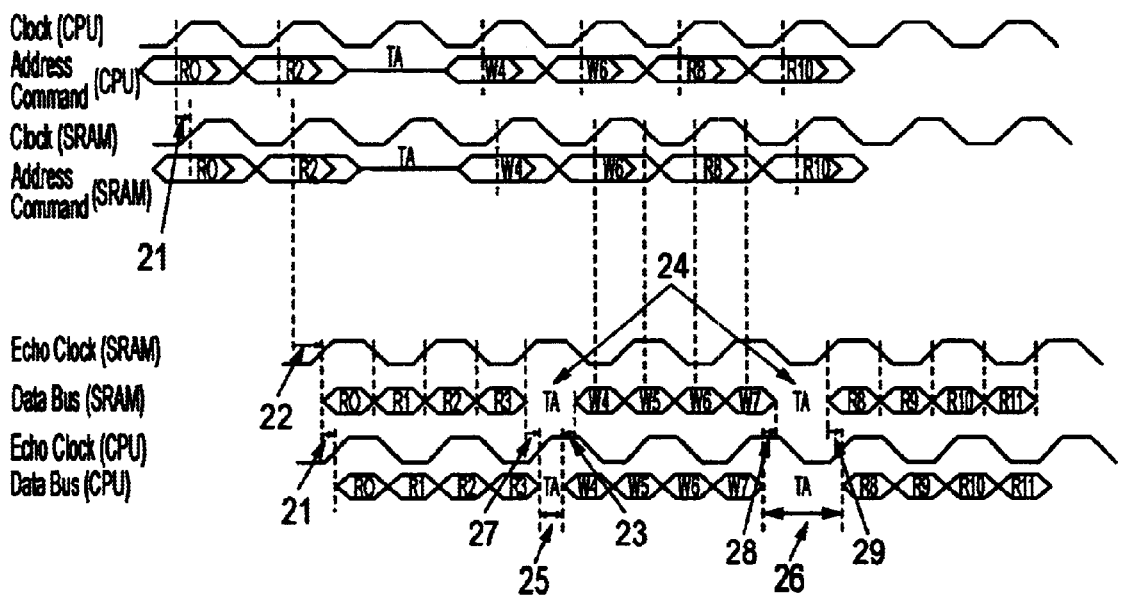

FIG. 5 is a diagram showing a processor 10 attached to an SRAM 19 in the DIU environment, along with a corresponding timing diagram. A processor 10 is connected to an SRAM 19 by means of several signals. A clock 11 signal controls the timing of events from the processor 1 to the SRAM 19. In this drawing it is shown as emanating from the processor, but other arrangements are possible. Requests are passed from the processor 10 to the SRAM 19 through an Address and Command Bus 12. This Drawing shows an Echo Clock 13 emanating from the SRAM 19 and terminating at the processor 10. Other configurations may not require this signal. Information is passed between the processor 10 and the SRAM 19 over the Data Bus 14. There is a time of flight delay 20 between when a signal at one end of a connecting wire is driven and when the same signal is received at the other end of the wire. There are similar time of flight delay for other signals 21 on other wires and in opposite directions 23 and 27. The SRAM 19 generates an echo clock signal 13 with a delay 22 which must be characterized. A Bus turn around delay 24 as seen on the pins of the SRAM 19 does not have the same timing parameters 25 and 26 as seen on the pins of the processor 10. This signals timing events are compressed 25 in one direction from inbound delay 27 and outbound delay 23, then expanded 26 on the opposite turn around from outbound delay 28 and inbound delay 29. The drawing shows that the length of wire connecting the processor 10 and the SRAM 19 is 2" in length. This length was chosen to represent a high level care used by the designer with respect to optimizing the placement of these devices. It is a worthy goal to make all such connecting line as close to the same length as is practicable, and overall, as small as possible.

Figure 6:
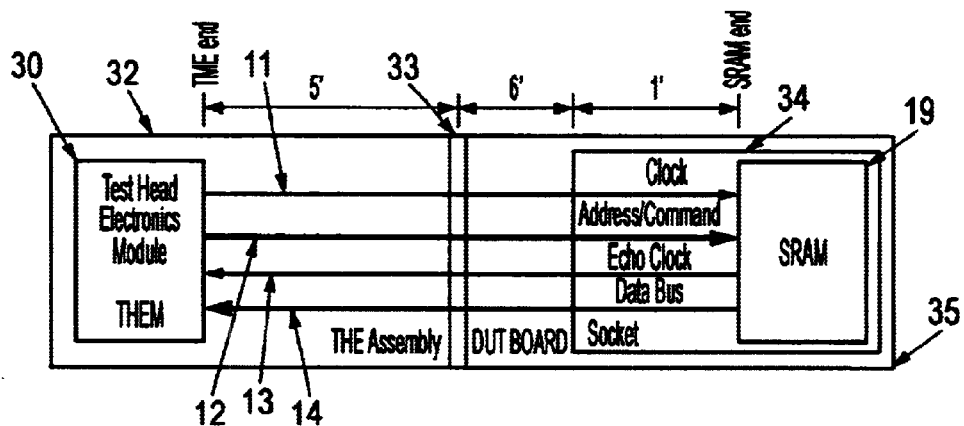
FIG. 6 is a diagram showing the SRAM of FIG. 5 in the prior art Device Under Test environment, along with a corresponding timing diagram.
Figure 6:
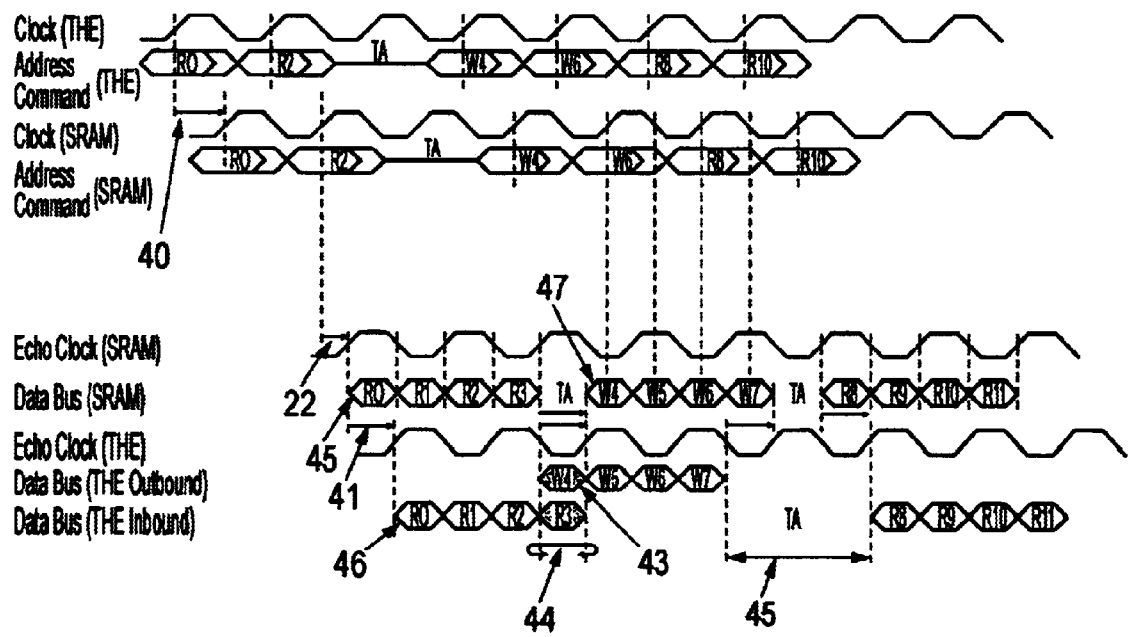

FIG. 6 is a diagram showing the SRAM of FIG. 5 in the prior art DUT environment, along with a corresponding timing diagram. The Test Head 32 containing the Test Head Electronic Modules 30 is connected to the Device Under Test Board 35 through the DUT Board Connector 33 and the socket 34. Other than the longer electrical length, the same electrical signals 11, 12, 13, and 14 interface the Device Under Test SRAM 19 to the Test Head Electronic Modules 30. Due directly to the longer electrical environment, there is a longer delay 40 from the THEM 30 to the SRAM 19, and a corresponding longer delay 41 back from the SRAM 19 to the THEM 30. With this longer delay 41, information 45-R0 driven from the SRAM 19 is not received 46-R0 by the THEM 30 until after the subsequent unit of information 45-R1 has already been driven from the SRAM 19. Likewise this same characteristic delay 41 causes information 43-W4 driven from the THEM 30 to arrive 47-W4 at the SRAM 19 after the subsequent unit of information 43-W5 has already been driven from the THEM 30. The learned observer will notice that the last unit of information 46-R3 arrives at the THEM 30 after the point in time where the THEM 30 must begin driving the next unit of information 43-W4 back to the SRAM 19. The turn around time 44 has become negative and cannot be realized on this tester, while the turn around time 45 has become excessive. The collision of inbound data 46-R3 with the outbound data 43-W4 is the problem the present invention overcomes.

Figure 7:
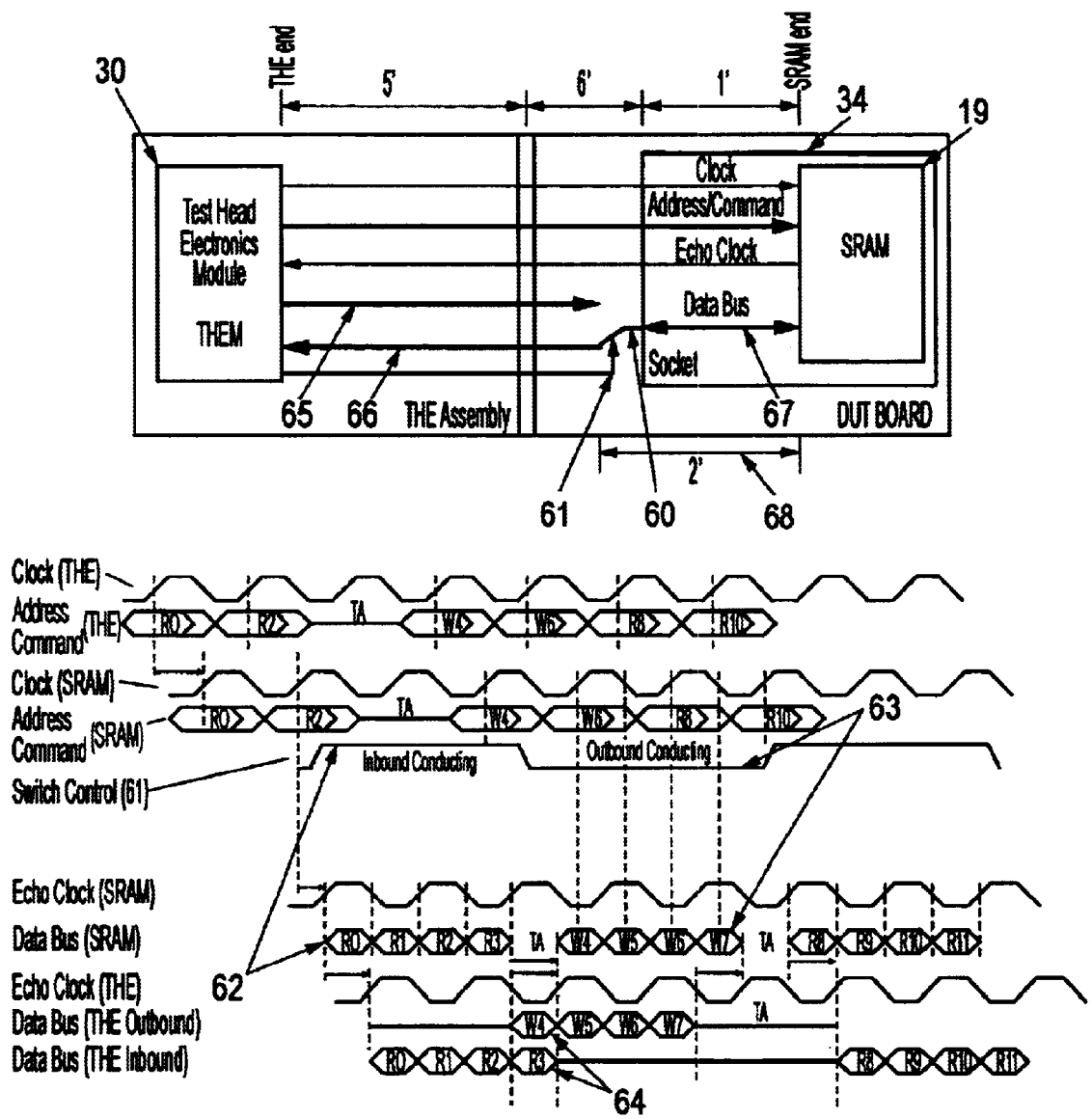
FIG. 7 is a conceptual diagram showing the test environment of FIG. 6 with a switch added on the DUT Board, along with a corresponding timing diagram.

FIG. 7 is a conceptual diagram showing the test environment of FIG. 6 with a switch added on the DUT board, along with a corresponding timing diagram. The Data Bus 14 of FIG. 5 has been replaces by 4 components in FIG. 6; a shortened Data Bus 67 connecting the Device Under Test 19 to the switch 60, the switch 60 itself, A data bus 65 dedicated to driving data from the THEM 30 towards the switch 60, and a data bus 66 dedicated to receiving data from the switch 60 at the THEM 30. To maximize its usefulness, the switch 60 must be placed 68 as close as practicable to the Device Under Test Socket 34 on the DUT Board 35. The required switch 60 must be able to allow information to pass from the THEM 30 on data bus 65, through the switch 60 to the Device Under Test 19 on data bus 67 without signal degradation, and must be able to allow information to pass from the Device Under Test 19 on data bus 67 through the switch 60 to the THEM 30 on data bus 66 without signal degradation. The switch 60 is controlled by the THEM 30 in two states; one state 62 allows data to pass from the DUT 19 to the THEM 30, the other state 63 allows data to pass from the THEM 30 to the DUT 19. By utilizing independent busses passing information in opposite directions there is no collision between inbound and outbound data traffic 64. This shortened data bus 67 fools the Device Under Test into thinking that it is operating the small electrical environment of the Device In Use. The independent outbound 65 and inbound 66 data busses prevent the collision of information 46-R3 with 43-W4 on the single signal wire 14 used in FIG. 5. The Device Under Test can now be tested in the electrical environment of the Device In Use.

Figure 8:
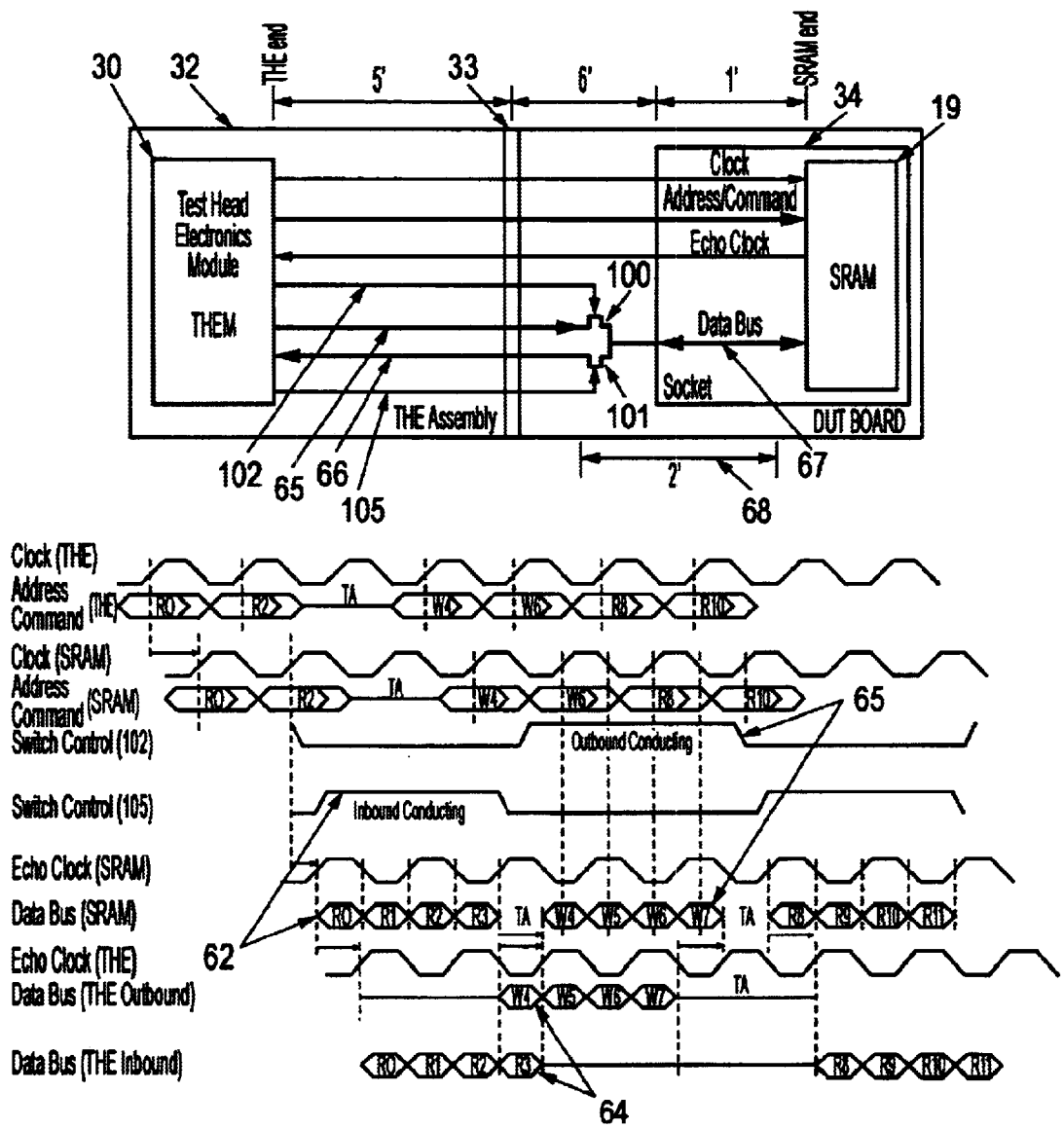
FIG. 8 is a diagram showing the test environment of FIG. 7, but where the switch has been replaced with a pair of MOS devices, along with a corresponding timing diagram.

FIG. 8 is a diagram showing the test environment of FIG. 7, but where the switch has been replaced with a pair of MOS devices, along with a corresponding timing diagram. The data bus 65 from the THEM 30 to the MOS device 100 operated as switch is connected to the small electrical environment data bus 67, while the MOS device 100 is controlled from the THEM 30 using signal wire 102. Likewise, data bus 66 from the MOS device 101 operated as a switch to the THEM 30 is connected to the small electrical environment data bus 67, while the switch 101 is controlled from the THEM 30 using signal wire 105.

Used as a switch, MOS devices have three problems which are overcome by utilizing the voltage generation capabilities of the electronics in the THEM. The first problem is that a MOS device used as a switch will not pass a voltage any higher than the voltage applied to the gate of the MOS device; this is known as "saturation," and is characterized by the gate threshold voltage ("$V_{th}$") of the MOS device. A second problem is that as the signal level approaches saturation, the impedance of the MOS device used as a switch increases; this is known as the body effect. A third problem is that the MOS device used as a switch can enter a conducting state when a signal on the source or drain of the MOS device is reduced below the gate voltage by an amount greater than the gate threshold voltage $V_{th}$, causing the device to conduct when it must be non-conducting. This is known as the "false turn on problem." MOS devices have been used as switches for a very long period of time in digital logic. Sometimes these very problems can be used as solutions in and of themselves. The saturation effect is often used to great advantage when coupling digital logic of differing voltage requirements together in a system. Here the saturation effect prevents the higher voltage section from overdriving any inputs in the lower voltage section while allowing signals to freely pass between the sections.

While the saturation effect is often used to good ends, the body effect is not. The body effect gradually degrades the MOS device from an ideal switch to a voltage regulation device. As such its impedance progressively gets higher as the device nears saturation. This can cause many unpleasant signal distortions in a transmission line environment such as that used in a test environment, and must be avoided when careful measurements are performed by the test program.

The GaAs electronics in the THEM can be instrumental for avoiding these three problems of using MOD devices as switches in a testing environment. Both the saturation effect and the body effect are overcome by programming the high voltage level on signal wires 102 and 105 to be at least 2 * $V_{th}$ above the highest expected voltage used on signal wires 65, 66, and 67 including any overshoot and noise. The false turn on problem is solved by programming the low voltage level used on signal wires 102 and 105 to be lower than the greatest amount of signal undershoot and noise expected to be encountered on signal wires 65, 66, and 67. This higher high voltage and lower low voltage allow the MOS device to operate very much like an Ideal switch in a testing environment.

No only do these MOS devices used as switches have the voltage levels controlled by the tester through the THEM, but the tester through the THEM is instrumental in positioning the rising and falling edges of the control signals with high precision and accuracy. The tester is capable of moving the time of these rising and falling edges of these control signals in very small units (typically 100 pico-seconds to 200 pico-seconds). The GaAs electronics in the THEM are capable of asserting a rising edges of 7 volts in only 200 pico-seconds, and similarly they are capable of asserting a falling edge of the (same) 7 volts in the (same) 200 pico-seconds, and assert these edges into low impedance transmission lines. With such fast edges, the MOS devices change from non-conduction to conduction or from conduction to non conduction in an amount of time similar to the edge speed asserted on its control gate. The electronics in the THEM, therefore, has the capability to utilize MOS devices as near ideal switches in a testing environment. By controlling the voltages applied, the time at which these signals are applied, and coordinate the turn on event of one MOS switch with the turn off event of a different MOS device, the tester through the THEM is capable of using these MOS devices as nearly ideal switches. And through these switches, the Device Under Test sees the electrical environment very similar to that of the Device In Use.

Figure 9:
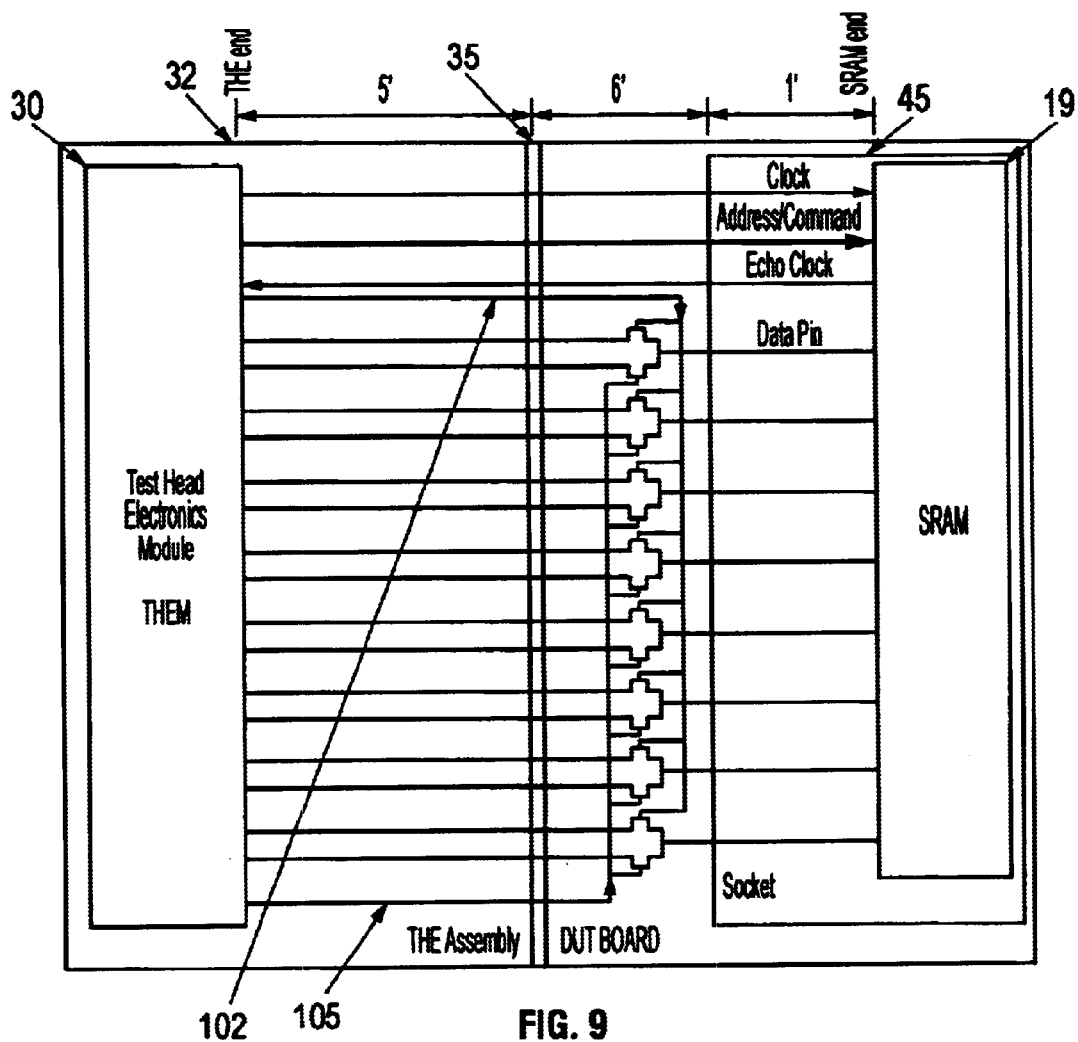
FIG. 9 is a diagram showing that a single tester control signal being used to control a plurality of MOS devices.

FIG. 9 is a diagram showing a single tester control signal being used to control a plurality of MOS devices. The THEM control signal 102 is used to control 8 MOS devices, while the THEM control signal 105 is used to control a different set of 8 MOS devices. There are a limited number of Test Head signals which are programmable in a manner required for controlling the MOS devices as switches. Each of these signals, so programmed, can be used to control a plurality of MOS devices as nearly ideal switches. Shown is a configuration where each THEM control signal controls 8 MOS devices. The number of MOS devices so controlled is determined by the electrical capabilities of the electronics in the THEM and the MOS devices themselves, and a person of ordinary skill in the art will appreciate that no loss of generality is implied by this drawing.

Figure 10:
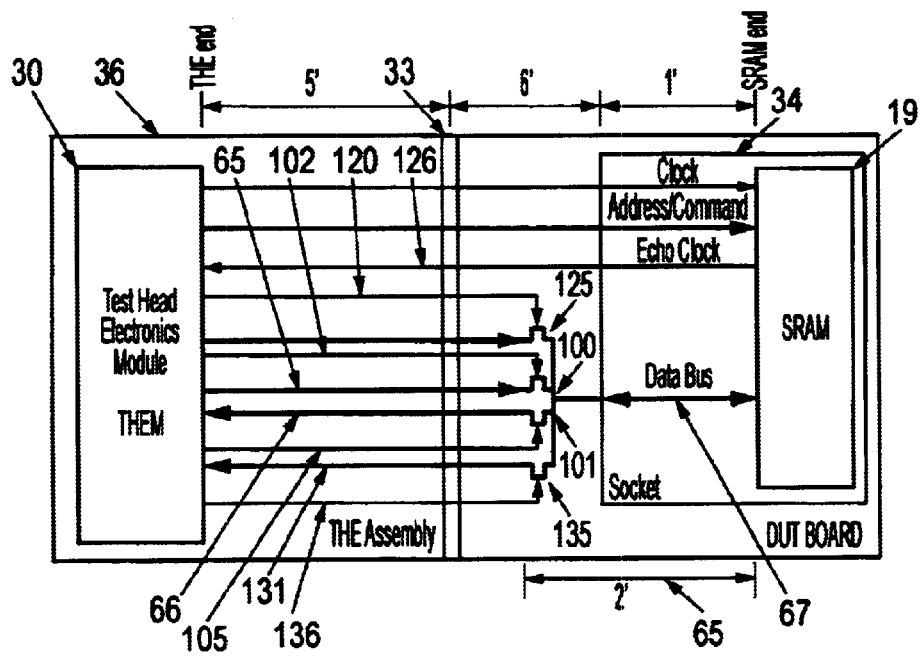
FIG. 10 is a diagram showing the test environment of FIG. 8, but an additional pair of MOS devices has been added to the DUT board so as to form two additional data busses, along with a corresponding timing diagram.
Figure 10:
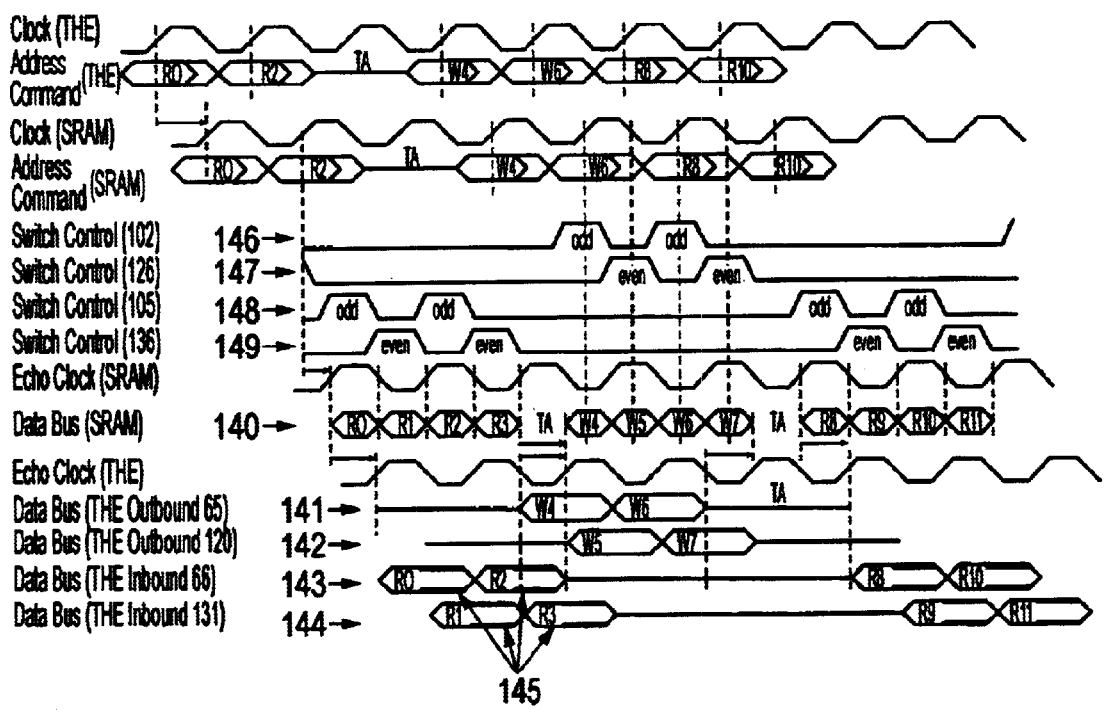

FIG. 10 is a diagram showing the test environment of FIG. 8, but an additional pair of MOS devices has been added to the DUT Board so as to form two additional data busses, along with a corresponding timing diagram. The data bus 65 controlled by signal 102 and the data bus 66 controlled by signal 105 are the same as found on FIG. 8. Another data bus 120 controlled by signal 126 is attached to the small electrical environment data bus 67 through another set of MOS devices 123, and is used as an additional means to send data from the THEM 30 to the Device Under Test 19. Another Data bus 131 controlled by signal 136 is attached to the small electrical environment data bus 67 through another set of MOS devices 133, and is used as an additional means to send data from the Device Under Test 19 to the THEM 30. Using this new configuration, the data transfers at the device under test 140 are as before, while the data transfers on the long wires 141, 142, 143, and 144 connecting the THEM to the switches takes place at ½ the rate at which the transfers occur on the small electrical environment data bus 67. The pair of switches 100 and 123 are operating as a multiplexer alternately allowing the signal on bus 65 and the signal on bus 120 to pass through the switch and travel onwards to the Device Under Test 19 over the small electrical environment data bus 67. Likewise, the pair of switches 101 and 133 are operated as a multiplexer alternately allowing the signals on the small electrical environment data bus 67 to be carries back to the THEM on data busses 66 and 131. The learned reader will notice that the data rate of the signals at the THEM 30 is can now be slower (½) than the data rate of the data at the Device Under Test 19. This same reader will also note that the signals 143 and 144 from the Device Under Test 19 on busses 66 and 131 are fully valid for only part of the data window. The fully valid interval of time directly corresponds to the time when the coupling switch 101 or 133 is conducting. The rest of the time, the signal is preserved only by the fact that no other signal is capable of disrupting the data. There is additional noise in the signals during this time as noted by 145. When careful measurements are performed by the tester, the tester must be carefully programmed to sample the signals during the low noise period of time where these signal first arrives at the THEM. A tester so enabled is now capable of testing this Device Under Test with a stream of data which may be faster than the capabilities of the same tester not so enabled. Therefore, this invention can be used to increase the frequency at which current art testers can test devices. The pulse trains 146, 147, 148, and 149 may be beyond the programming capabilities of many current art testers.

Figure 11:
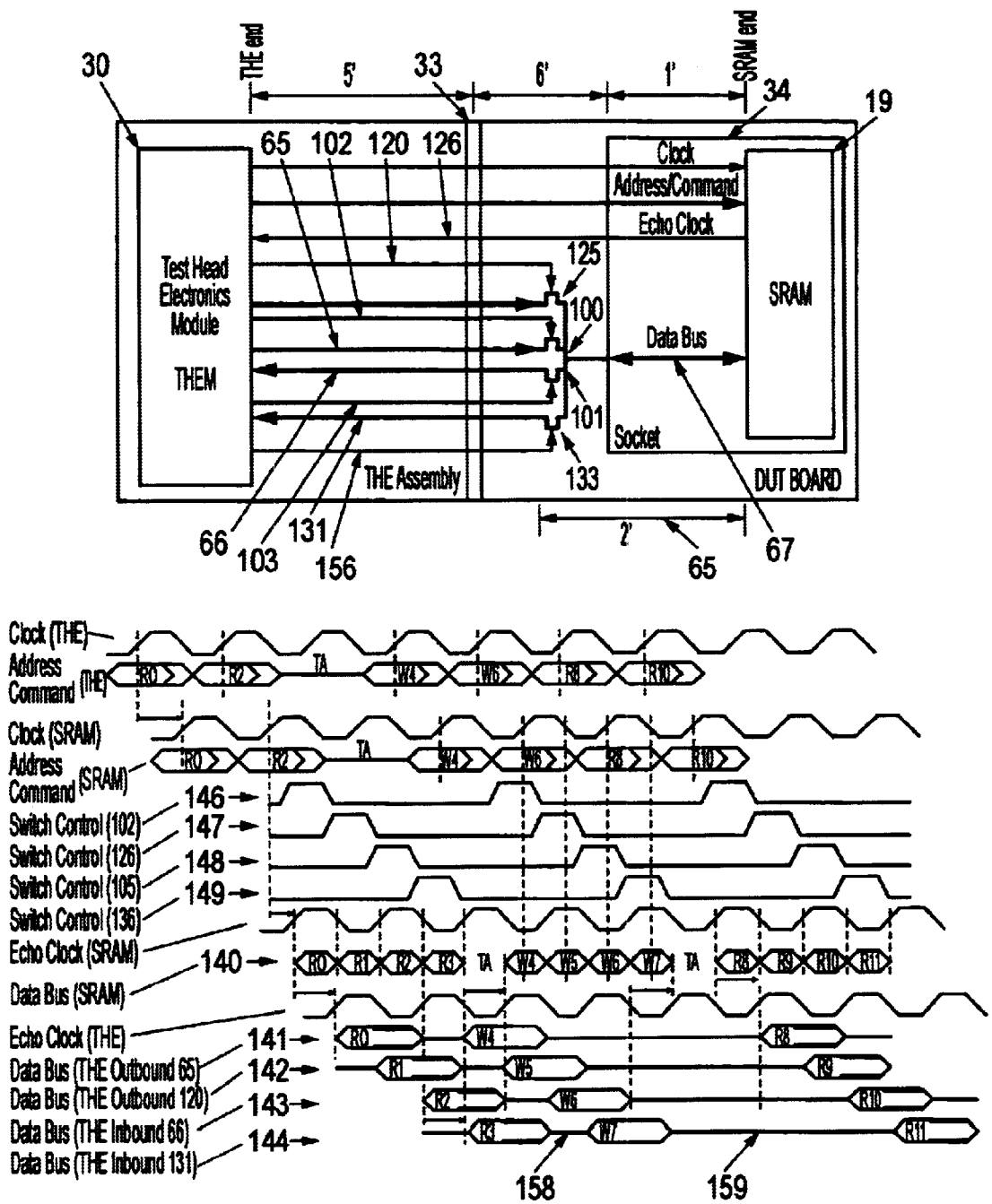
FIG. 11 is a diagram showing the same testing environment as FIG. 10, along with a different timing diagram.

FIG. 11 is a diagram showing the same testing environment as FIG. 10, but utilizing a different timing diagram. Instead of utilizing only data busses 65 and 120 to carry signals from the THEM 30 to the Device Under Test 19, and only utilizing data busses 66 and 131 to carry signals from the Device Under Test 19 to the THEM 30, four data busses are used to carry signals to and from the DUT. The Pulse trains 146, 147, 148, and 149 are now much easier to program on the tester, and all known high performance testers have the capabilities to generate such pulse trains. The corresponding data patterns on the data busses 141, 142, 143, and 144 at the THEM 30 are, similarly, simplified with ample event 158 to event 159 margins. Using this programming style, the tester configuration of FIG. 11 is capable of testing devices at twice its rates speed.

Figure 12:
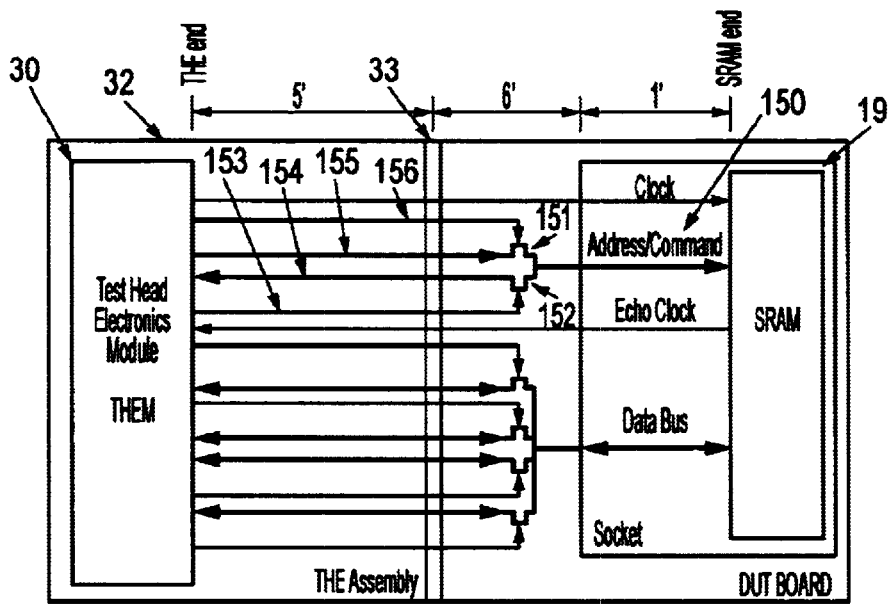
FIG. 12 is a diagram showing a test environment for another embodiment of the present invention, along with a corresponding timing diagram.
Figure 12:
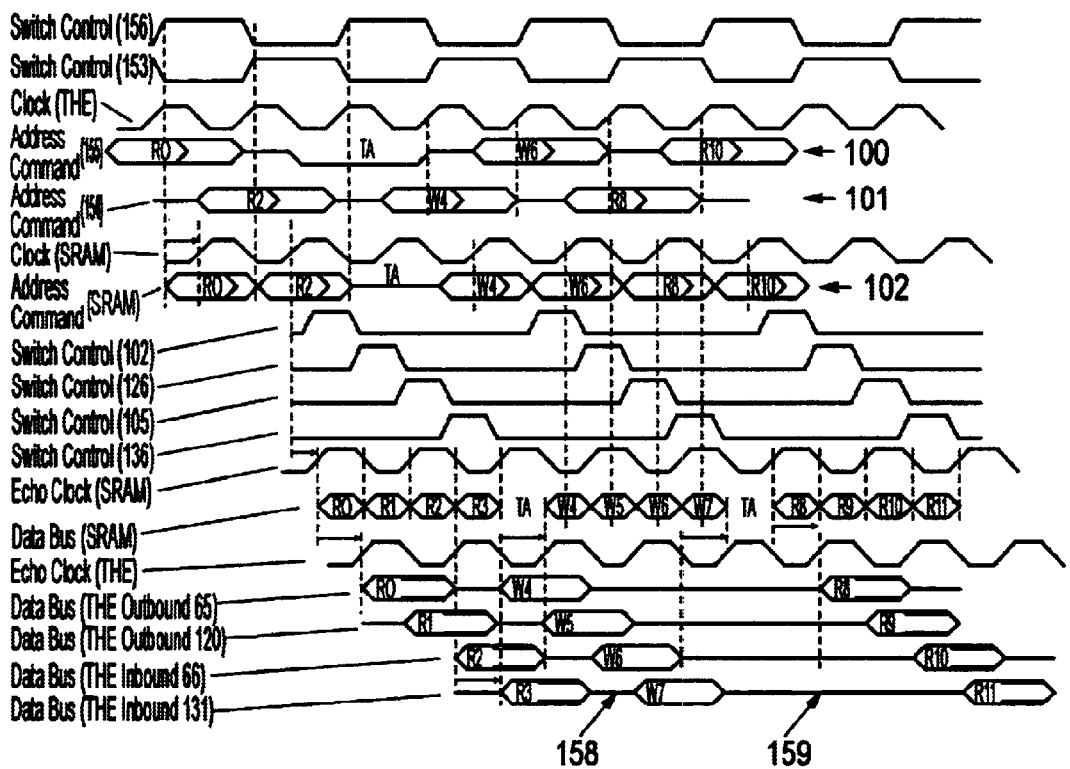

FIG. 12 is a diagram showing a test environment for another embodiment of the present invention, along with a corresponding timing diagram. The address and control bus of FIG. 11 has been replaces by 5 components; a small electrical environment address and command bus 150, a pair of signal busses 154 and 155, controlled by a pair of corresponding signals 153, and 156. In a similar manner as FIG. 10 and FIG. 11, this organization allows signals over the two new address and command busses 161 and 162 to emanate from the THEM 30 at a slower rate than they arrive 162 at the Device Under Test 19.

The present invention can be used in isolation as in FIG. 8 or in concert with itself as in FIG. 10 or FIG. 11, or it can be used simultaneously with other configurations of the present invention as in FIG. 12.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for high-frequency testing of a semiconductor device under test comprising:
    a tester having test head electronics associated therewith, said test head electronics having a pin;
    a DUT board, said DUT board having a socket for said device under test;
    first and second switches each having an on state and an off state, said first and second switches being disposed between said tester and said socket, and having a common node;
    a first transmission line extending between said pin and said first switch;
    a second transmission line extending between said common node and said socket; and
    a third transmission line extending between said tester and said first and second switches, said third transmission line configured to control said first and second switches, such that when said first switch is in an on state, said second switch is in an off state, and when said first switch is in an off state, said second switch is in an on state;
    wherein said system is operable to apply a set of test signals to said DUT board of a higher frequency than achievable by said test head electronics alone.

2. The system for high speed testing of claim 1 wherein said first and said second switches are constructed from FET devices.

3. A system for testing a semiconductor devices under a test comprising:
    a tester having test head electronics associated therewith;
    a DUT board, said DUT board having a socket for said device under test, said socket having a pin;
    a plurality of switches having a conducting and a non-conducting state, said switches being disposed on said OUT board proximate to said socket, and having a common node;
    a first wire extending from said pin on said socket to said common node of said plurality of switches;
    a plurality of additional wires extending from said plurality of switches to said test head electronics;
    wherein said plurality of switches are controlled by signals from said test head electronics such that when any one of said plurality of switches is in said conducting state, all other of said plurality of switches are in said non-conducting state;
    wherein said system is operable to apply a set of test signals to said DUT board of a higher frequency than achievable by said test head electronics alone.

4. The system for high speed testing of claim 3 wherein any of said plurality switches is constructed from FET devices.

5. A system for testing of semiconductor devices under test comprising:
    a tester having test head electronics associated therewith;
    a DUT board, said DUT board having a socket for said device under test;
    a first set of switches disposed on said DUT board, said first set of switches having a first common node, and a first plurality of wires extending to said test head electronics;
    a second set of switches disposed on the DUT board, said second set of switches having a second common node, and a second plurality of wires extending to said test head electronics;

wherein said system is operable to apply a set of test signals to said DUT board of a higher frequency than achievable by said test head electronics alone.

6. The system for testing of semiconductor devices of claim 5, wherein said first set of switches is operated at one frequency, and said second set of switches is operated at a second frequency.

7. A method for increasing the frequency at which semiconductor devices can be tested comprising:

interposing a set of switches along signal paths between a tester and a device under test;

controlling said switches with signals generated by said tester, thereby selectively enabling communication of a test signal to said device under test, and selectively enabling communication of a response signal generated by said device under test to said tester, and applying a set of test signals to said DUT board at a higher frequency than achievable by said test head electronics alone.

8. A method for increasing the speed at which a tester can perform its testing functions, said tester having test head electronics comprising a set of data pins and a plurality of receivers, comprising:

reducing the effective length of a plurality of signaling wires extending between said test head electronics and a device under test on a DUT board by interposing a switching mechanism proximate to said device under test in at least some of said signaling wires, whereby signals traveling in opposite directions are routed along distinct paths, thereby enabling the application of a set of test signals to said DUT board at a higher frequency than achievable by said test head electronics alone.

9. The method of claim 8, wherein said switches are used to switch between said distinct paths connecting said device under test to said test head electronics at a rate more rapid than can be generated by said set of data pins in said test head electronics.

10. The method of claim 8, where said switches are used to switch between said plurality of distinct paths connecting said DUT to said test head electronics modules at a rate more rapid than any single receiver on said test head electronics is capable of effectively receiving.

11. A method for increasing the speed at which a tester can perform its testing functions, said tester having test head electronics comprising a set of data pins and a plurality of receivers, comprising:

routing a plurality of signaling wires extending between a tester and a device under test by interposing a switching mechanism proximate to said device under test in at least some of the signal wires extending between said test head electronics and said device under test, whereby signals traveling;

thereby enabling the application of a set of test signals to said DUT board at a higher frequency than achievable by said test head electronics alone.

12. The method of claim 11, wherein said switches are used to switch between said paths connecting said device under test to said test head electronics at a rate more rapid than can be generated by said data pins in said test head electronics.

13. The method of claim 11, where said switches are used to switch between said paths connecting the device under test to said test head electronics modules at a rate more rapid than any single receiver on the test head electronics modules is capable of receiving.

* * * * *